US011777482B2

(12) United States Patent
Chen

(10) Patent No.: US 11,777,482 B2
(45) Date of Patent: Oct. 3, 2023

(54) GAIN-BOOSTED COMPARATOR

(71) Applicant: MEDIATEK INC., Hsin-Chu (TW)

(72) Inventor: Pin-Wen Chen, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 17/692,142

(22) Filed: Mar. 10, 2022

(65) Prior Publication Data

US 2022/0376685 A1 Nov. 24, 2022

Related U.S. Application Data

(60) Provisional application No. 63/192,139, filed on May 24, 2021.

(51) Int. Cl.
*H03K 5/22* (2006.01)
*H03F 3/45* (2006.01)
*H03K 3/037* (2006.01)
*H03K 19/20* (2006.01)

(52) U.S. Cl.
CPC ........... *H03K 5/22* (2013.01); *H03F 3/45269* (2013.01); *H03K 3/037* (2013.01); *H03K 19/20* (2013.01)

(58) Field of Classification Search
CPC ............ G01R 19/0038; H03K 5/2418; H03K 5/2445; H03K 5/2481
USPC .......................................................... 327/65
See application file for complete search history.

(56) References Cited

U.S. PATENT DOCUMENTS 6,157,587 A * 12/2000 Reddy .................... G11C 7/065
365/207
8,031,188 B2 10/2011 Nakajima 8,829,942 B2 * 9/2014 Chan ........................ H03K 5/22
327/65
2017/0063361 A1 * 3/2017 Jenkins .................. H03K 5/249
2019/0286178 A1 9/2019 Wei
(Continued)

FOREIGN PATENT DOCUMENTS

CN 104036812 B 4/2017
CN 108347234 A 7/2018
(Continued)

OTHER PUBLICATIONS

Wei-Hsin Tseng et al., "A 12-bit 104 MS/s SAR ADC in 28nm CMOS for Digitally-Assisted Wireless Transmitters", IEEE Journal of Solid-State Circuits, vol. 51, No. 10, Oct. 2016, pp. 2222-2231, Oct. 2016.
(Continued)

*Primary Examiner* — Quan Tra

(74) *Attorney, Agent, or Firm* — Winston Hsu

(57) ABSTRACT

The present invention provides a dynamic comparator including a dynamic amplifier and a latch circuit. The dynamic amplifier includes a first input pair, a current source and a gain boosting circuit. The first input pair is configured to receive an input signal to generate an amplified signal at an output terminal. The current source is coupled between the first input pair and a first reference voltage. The gain-boosting circuit is coupled between the first input pair and a second reference voltage, and is configured to receive the input signal to selectively inject current to the output terminal or sink current from the output terminal. The latch circuit is coupled to the dynamic amplifier, and is configured to receive the amplified signal to generate an output signal.

11 Claims, 10 Drawing Sheets

(56) References Cited

U.S. PATENT DOCUMENTS

2019/0334514 A1* 10/2019 Xu ...................... H03K 19/003
2021/0067150 A1    3/2021 Lee

FOREIGN PATENT DOCUMENTS

| CN | 110247661 A | | 9/2019 | | |
|---|---|---|---|---|---|
| CN | 110289838 A | * | 9/2019 | ........... | H03K 5/2481 |
| CN | 110995214 A | | 4/2020 | | |
| CN | 111313871 A | | 6/2020 | | |
| WO | 95/02280 | | 1/1995 | | |
| WO | WO-2021200416 A1 | * | 10/2021 | | |

OTHER PUBLICATIONS

Chun-Cheng Liu et al., "A 12 bit 100 MS/s SAR-Assisted Digital-Slope ADC", IEEE Journal of Solid-State Circuits, vol. 51, No. 12, Dec. 2016, pp. 2941-2950, Dec. 2016.
Pieter Harpe et al., "A 10b/12b 40 kS/s SAR ADC With Data-Driven Noise Reduction Achieving up to 10.1b ENOB at 2.2 fJ/Conversion-Step", IEEE Journal of Solid-State Circuits, vol. 48, No. 12, Dec. 2013, pp. 3011-3018, Dec. 2013.
Chun-Cheng Liu et al., "A 0.46mW 5MHz-BW 79.7dB-SNDR Noise-Shaping SAR ADC with Dynamic-Amplifier-Based FIR-IIR Filter", ISSCC 2017 / Session 28 / Hybrid ADCs / 28.1, 2017 IEEE International Solid-State Circuits Conference, 2017, pp. 466-467,467a.

* cited by examiner

GAIN-BOOSTED COMPARATOR

CROSS REFERENCE TO RELATED APPLICATIONS

This application claims the priority of U.S. Provisional Application No. 63/192,139 (filed on 2021 May 24), which is included herein by reference in its entirety.

BACKGROUND

There are many applications that need high-speed and low-noise comparators, for example, a high-speed and high-resolution successive-approximation register analog-to-digital converter (SAR ADC). For the high speed consideration, a two-stage dynamic comparator is widely used because it can operate in a low supply voltage.

The conventional two-stage dynamic comparator comprises an amplifier and a latch, wherein the amplifier is used to amplify an input signal to generate an output signal, and the latch is used to store the output signal of the amplifier. The dynamic comparator works in two phases, that is an amplification phase and a reset phase. In the amplification phase, the amplifier works like an integrator to integrate the input signal, however, a gain of the amplifier is limited due to a transconductance of an input pair of the amplifier, and the limited gain will lower the noise performance. Therefore, how to provide a dynamic comparator with higher gain is an important topic.

SUMMARY

It is therefore an objective of the present invention to provide a dynamic comparator which has higher gain for a longer period of time, to solve the above-mentioned problems.

According to one embodiment of the present invention, a dynamic comparator comprising a dynamic amplifier and a latch circuit is disclosed. The dynamic amplifier comprises a first input pair, a current source and a gain boosting circuit. The first input pair is configured to receive an input signal to generate an amplified signal at an output terminal. The current source is coupled between the first input pair and a first reference voltage. The gain-boosting circuit is coupled between the first input pair and a second reference voltage, and is configured to receive the input signal to selectively inject current to the output terminal or sink current from the output terminal. The latch circuit is coupled to the dynamic amplifier, and is configured to receive the amplified signal to generate an output signal.

According to another embodiment of the present invention, a dynamic comparator comprising a dynamic amplifier and a latch circuit is disclosed. The dynamic amplifier comprises a first input pair, a second input pair, a first current source and a second current source. The first input pair and the second input pair are configured to receive an input signal to generate an amplified signal at an output terminal. The first current source is coupled between the first input pair and a first reference voltage. The second current source is coupled between the second input pair and a second reference voltage. The latch circuit is coupled to the dynamic amplifier, and is configured to receive the amplified signal to generate an output signal. In addition, the first current source and the second current source are controlled by a first clock signal, so that the first input pair samples the input signal at a rising edge of the first clock signal, and the second input pair samples the input signal at a falling edge of the first clock signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
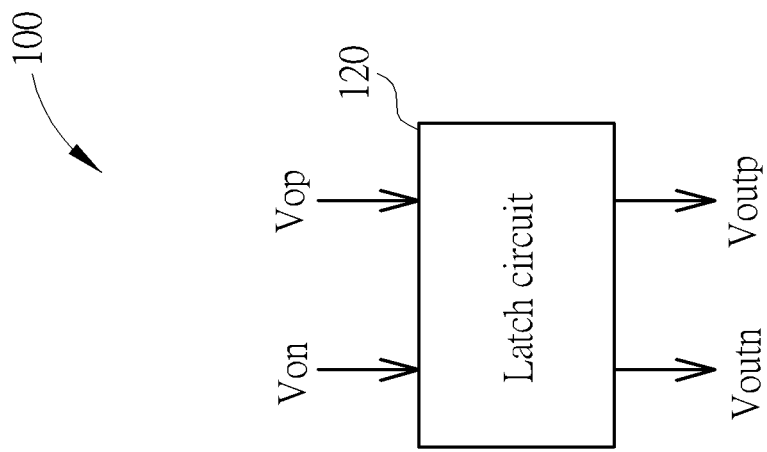
FIG. 1 is a diagram illustrating a dynamic comparator according to one embodiment of the present invention.
Figure 1:
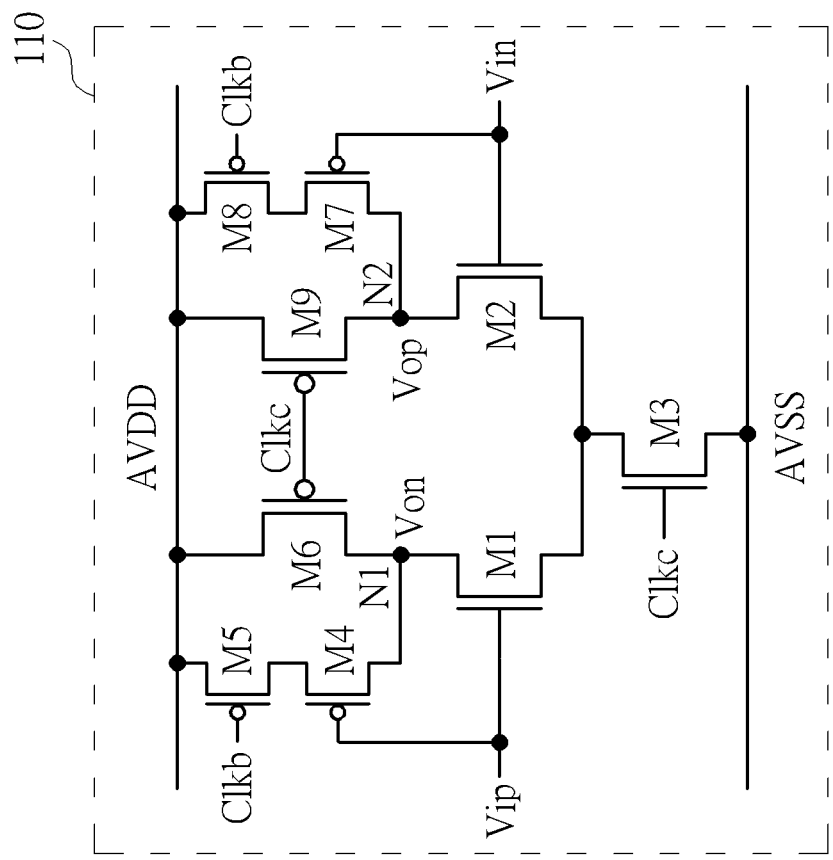

FIG. 1 is a diagram illustrating a dynamic comparator 100 according to one embodiment of the present invention. As shown in FIG. 1, the dynamic comparator 100 comprises a dynamic amplifier 110 and a latch circuit 120, wherein the dynamic amplifier 110 comprises transistors M1-M9 coupled between a reference voltage AVDD (i.e. a supply voltage) and a reference voltage AVSS (i.e., aground voltage). The dynamic comparator 100 can be used in any circuit requiring higher gain and lower power consumption, such that the dynamic comparator 100 can be used in a SAR ADC.

In the dynamic comparator 100, the dynamic amplifier 110 is configured to receive input signals Vip and Vin (differential input signal) to generate amplified signals Von and Vop (differential amplified signal) at output terminals N1 and N2, and the latch circuit 120 receives the amplified signals Von and Vop to generate output signals Voutn and Voutp. Regarding the dynamic amplifier 110, each of the transistors M1 and M2 is implemented by an N-type Metal-Oxide-Semiconductor (NMOS), and the transistors M1 and M2 serve as an input pair to receive the input signals Vip and Vin to generate the amplified signals Von and Vop at the gain electrodes of the transistors M1 and M2 (i.e., the output terminals N1 and N2). The transistor M3 is implemented by an NMOS coupled between the source electrode of the transistor M1/M2 and the reference voltage AVSS, and the transistor M3 serves as a current source that is used to enable or disable the amplification phase of the dynamic amplifier 110. Each of the transistors M4-M9 is implemented by a P-type Metal-Oxide-Semiconductor (PMOS), wherein the transistor M4 is coupled to the output terminal N1, the transistor M5 is coupled between the reference voltage AVDD and the transistor M4, the transistor M6 is coupled between the reference voltage AVDD and the output terminal N1, the transistor M7 is coupled to the output terminal N2, the transistor M8 is coupled between the reference voltage AVDD and the transistor M7, the transistor M9 is coupled between the reference voltage AVDD and the output terminal N2. The transistors M4 and M7 serves as another input pair to receive the differential input signal Vip and Vin to boost the gain of the dynamic amplifier 110. In this embodiment, the transistors M3, M6 and M9 are controlled by a clock signal Clkc, and the transistors M5 and M8 are controlled by a clock signal Clkb, wherein the clock signal Clkc is used to enable the transistor M3 to amplify the input signals Vip and Vin to generate the amplified signals Von and Vop, and the clock signal Clkb is used to disable the M5 and M8 when the latch circuit 120 successfully generates the output signals Voutn and Voutp to lower the power consumption. In addition, the clock signal Clkb is generated according to the clock signal Clkc, and the clock signal Clkb can enable or disable the transistors M5 and M8 at an appropriate time.

In this embodiment, the transistors M4, M5, M7 and M8 can be regarded as a gain-boosting circuit to boost the gain of the dynamic amplifier 110.

Figure 2:
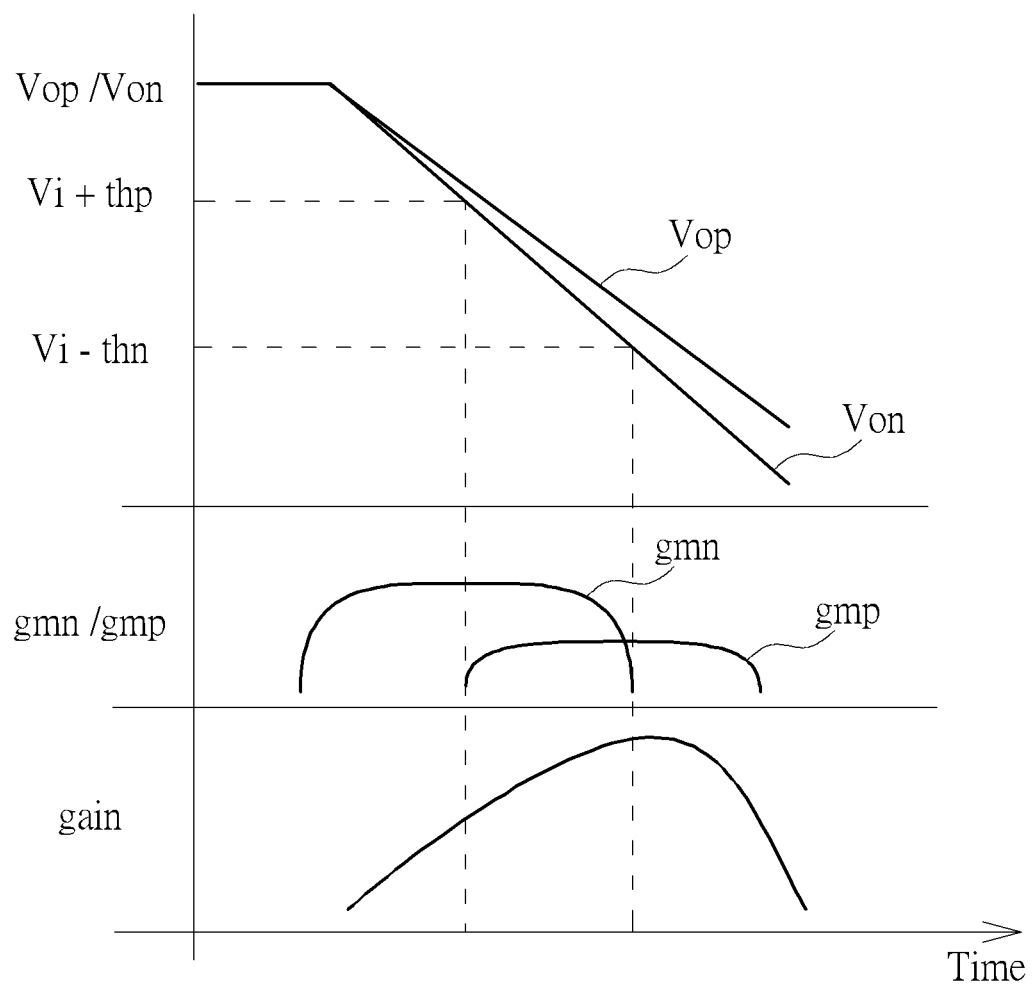
FIG. 2 shows a timing diagram of the signals and characteristics of the dynamic amplifier according to one embodiment of the present invention.

Referring to FIG. 1 and FIG. 2 together, FIG. 2 shows a timing diagram of the signals and characteristics of the dynamic amplifier 110 according to one embodiment of the present invention, wherein the timing diagram corresponds to a rising edge of the clock signal Clkc (i.e. the clock signal Clkc goes from a low voltage level to a high voltage level) and the following high voltage level of the clock signal Clkc. In the beginning, the clock signal Clkc has the low voltage level, so the transistor M3 is disabled while the transistors M6 and M9 are enabled, and the amplified signals Von and Vop have high voltage levels. At this time, the clock signal Clkb enables the transistors M5 and M8. Then, when the voltage level of the clock signal Clkc starts to increase, the transistor M3 is enabled and a current path is formed, so that the voltage levels of the amplified signals Von and Vop starts to decrease. At this time, the dynamic amplifier 110 works like an integrator, the transistors M1 and M2 operate in a saturation region, and the transistors M1 and M2 have higher transconductance (i.e., the symbol "gmn" in FIG. 2) to increase the gain of the dynamic amplifier 110. When the amplified signals Von and Vop drop to a threshold "Vi+thp", the transistors M4 and M7 start to operate in the saturation region, and the transistors M4 and M7 have higher transconductance (i.e., the symbol "gmp" in FIG. 2) to increase the gain of the dynamic amplifier 110, wherein "Vi" represents the input signal Vin or Vip, and "thp" represents a threshold voltage of the transistor M4/M7. Then, when the amplified signals Von and Vop drop to a threshold "Vi−thn", the transistors M1 and M2 do not operate in the saturation region, and the transistors M1 and M2 have lower transconductance, but the transistors M4 and M7 still have higher transconductance to maintain the gain of the dynamic amplifier 110. Finally, the amplified signals Von and Vop continue to decrease, and the transistors M4 and M7 do not operate in the saturation region so that the transistors M4 and M7 have lower transconductance, and the gain of the dynamic amplifier 110 decreases.

In the embodiment shown in FIG. 1 and FIG. 2, the dynamic amplifier 110 has two input pairs, one input pair comprises the transistors M1 and M2 (NMOS), and the other input pair comprises the transistors M4 and M7 (PMOS). Therefore, because the transistors M4 and M7 are used to inject the current to the output terminals N1 and N2, the gain of the dynamic amplifier 110 will increase. In addition, because the transistors M1 and M2 provide the tranconductance gmn during a first period, the transistors M4 and M7 provide the tranconductance gmp during a second period, the first period is earlier than the second period, and the second period and the first period are partially overlapped, so the dynamic amplifier 110 will have higher gain and longer amplification phase (i.e., the time the dynamic amplifier 110 has gain will become longer).

In addition, in order to ensure the normal operation of the dynamic amplifier 110, the current provided by the PMOS M4/M5/M7/M8 is smaller than the current provided by the NMOS M1/M2, so that the amplified signals Von and Vop decrease to zero during the amplification phase, to make sure that the latch circuit 120 can work properly.

Figure 3:
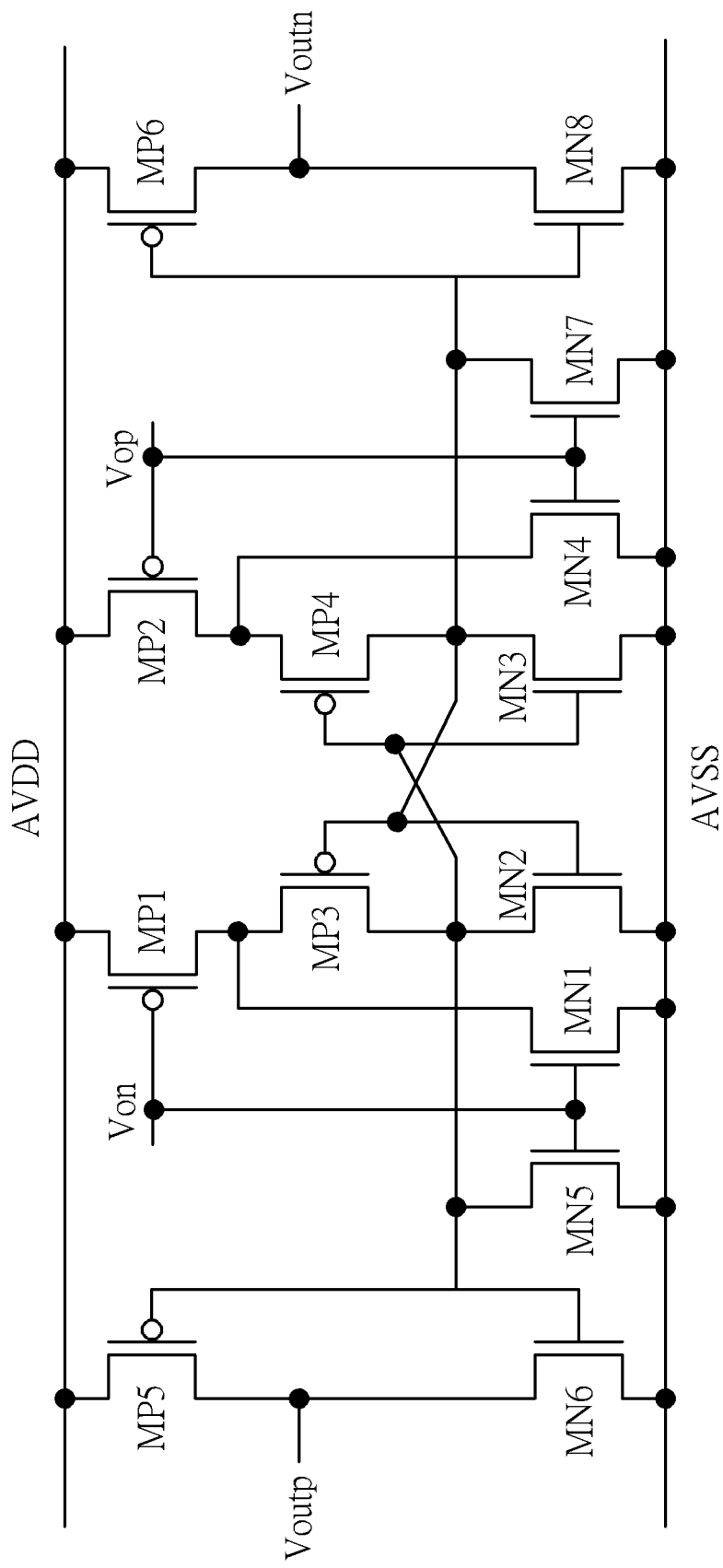
FIG. 3 is a diagram illustrating the latch circuit according to one embodiment of the preset invention.

FIG. 3 is a diagram illustrating the latch circuit 120 according to one embodiment of the preset invention. As shown in FIG. 3, the latch circuit 120 comprises a plurality of NMOSs MN1-MN8 and a plurality of PMOSs MP1-MP6 coupled between the reference voltage AVDD and the reference voltage AVSS. The latch circuit 120 is used to receive the amplified signals Von and Vop to generate output signals Voutp and Voutn, and when the latch circuit 120 is ready (the output signals Voutp and Voutn are generated successfully), one of the output signals Voutp and Voutn corresponds to a high voltage level while the other one of the output signals Voutp and Voutn corresponds to a low voltage level. In addition, because a person skilled in the art should understand the operation of the latch circuit 120, the further description of the latch circuit 120 is omitted here. It is noted that the latch circuit 120 shown in FIG. 3 is just an example, not a limitation of the present invention.

Figure 4:
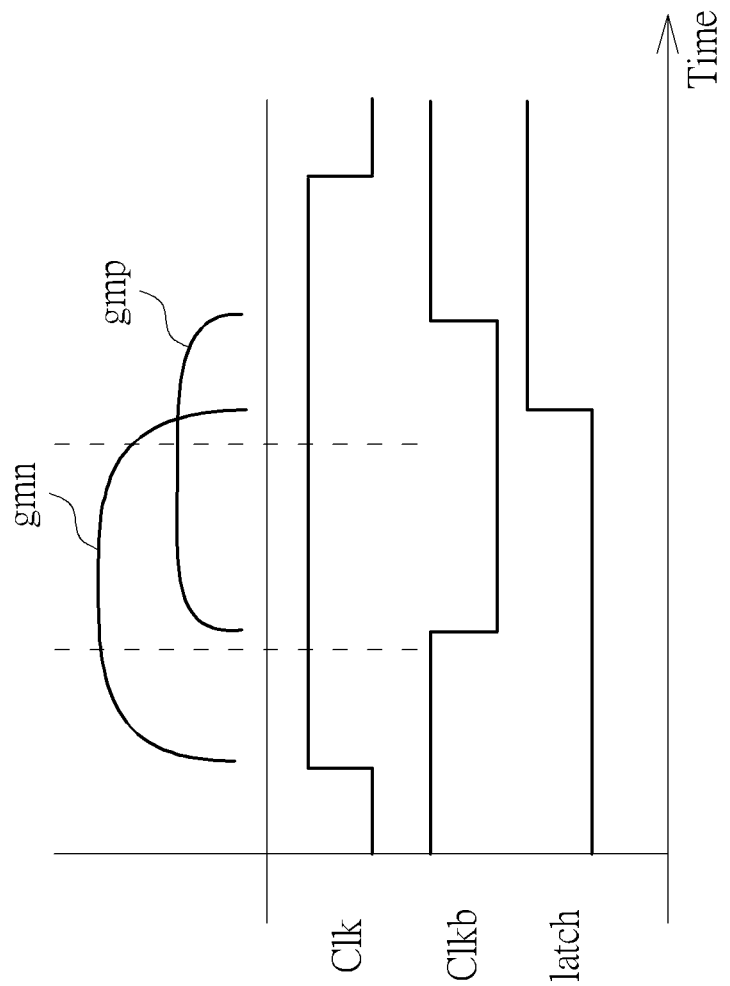
FIG. 4 shows a diagram illustrating a logical circuit configured to generate the clock signal Clkb and the corresponding timing diagram according to one embodiment of the present invention.
Figure 4:
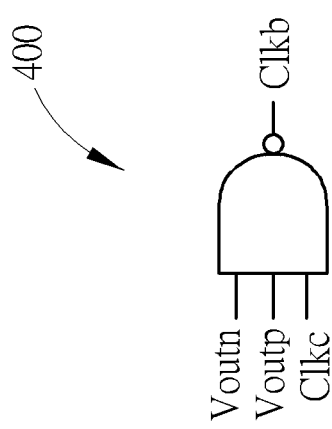

In order to lower the power consumption, the clock signal Clkb is controlled to have the high voltage level to disable the transistors M5 and M8 when the latch circuit 120 is ready. FIG. 4 shows a diagram illustrating a logical circuit 400 configured to generate the clock signal Clkb and the corresponding timing diagram according to one embodiment of the present invention. As shown in FIG. 4, the logical circuit 400 is implemented by a NAND gate, and the logical circuit 400 receives the clock signal Clkc, the output signals Voutn and Voutp to generate the clock signal Clkb. Specifically, when the clock signal Clkc has the high voltage level and the latch circuit 120 is not ready, all of the clock signal Clkc and the output signals Voutn/Voutp have the high voltage levels, and the clock signal Clkb has the low voltage level to enable the transistors M5 and M8. Then, when the latch circuit 120 is ready (i.e., the latch goes high shown in FIG. 4), one of the output signals Voutn and Voutp becomes the low voltage level, and the logical circuit 400 generates clock signal Clkb with the high voltage level to disable the transistors M5 and M8.

It is noted that the NAND gate shown in FIG. 4 is only an example, as long as the logical circuit 400 can generate the clock signal Clkb with the low voltage level to enable the transistors M5 and M8 during part of the amplification phase, and the logical circuit 400 can generate the clock signal Clkb with the high voltage level when the latch circuit 120 is ready, the logical circuit 400 can be implemented by other components.

Figure 5:
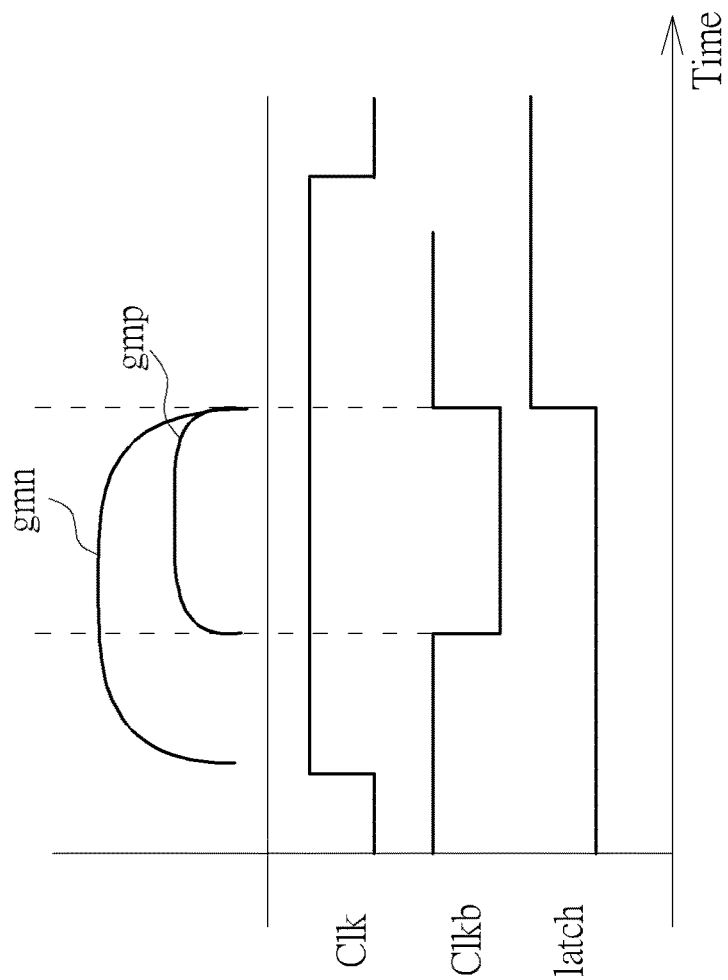
FIG. 5 shows a diagram illustrating a logical circuit configured to generate the clock signal Clkb and the corresponding timing diagram according to another embodiment of the present invention.
Figure 5:
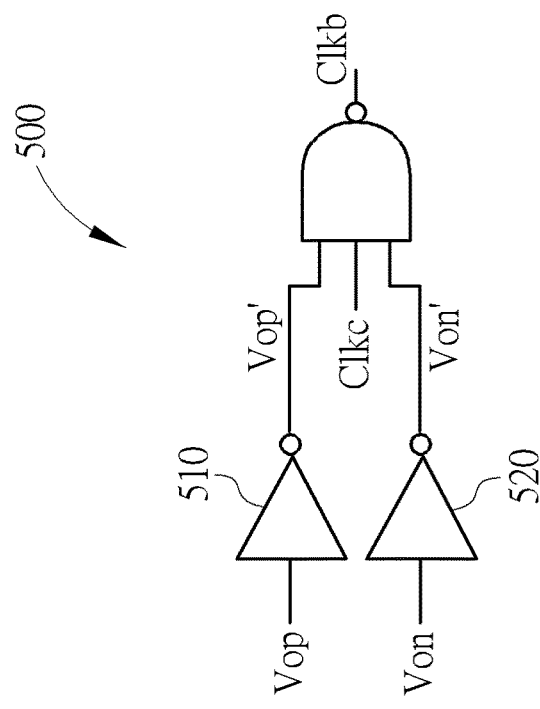

FIG. 5 shows a diagram illustrating a logical circuit 500 configured to generate the clock signal Clkb and the corresponding timing diagram according to another embodiment of the present invention. As shown in FIG. 5, the logical circuit 500 comprises two inverters 510, 520 and a NAND gate 530. The inverter 510 receives the amplified signal Vop to generate an inverted amplifier signal Vop', the inverter 520 receives the amplified signal Von to generate an inverted amplifier signal Von', and the NAND gate 530 receives the inverted amplifier signal Vop', the inverted amplifier signal Von' and the clock signal Clkc to generate the clock signal Clkb. Specifically, when the clock signal Clkc has the high voltage level and the amplified signals Vop and Von have the high voltage level (i.e., the latch circuit 120 is not ready), the clock signal Clkb has the low voltage level to enable the transistors M5 and M8. Then, when the amplified signals Vop and Von have the low voltage level (i.e., the latch circuit 120 is ready), the logical circuit 400 generates clock signal Clkb with the high voltage level to disable the transistors M5 and M8.

In the embodiment shown in FIG. 5, the inverters 510 and 520 can be replica of portion of the latch circuit 120 shown in FIG. 3, that is the PMOSs MP1, MP2 and NMOSs MN1, MN4. Therefore, the logical circuit 400 can generate clock signal Clkb with the high voltage level disable the transistors M5 and M8 immediately when the latch circuit 120 is ready, to save more power consumption.

It is noted that the NAND gate shown in FIG. 5 is only an example, as long as the logical circuit 500 can generate the clock signal Clkb based on the clock signal Clkc and the amplified signals Vop and Von, to make the clock signal Clkb has the low voltage level to enable the transistors M5 and M8 during part of the amplification phase, and the clock signal Clkb has the high voltage level when the latch circuit 120 is ready, the logical circuit 500 can be implemented by other components.

Figure 6:
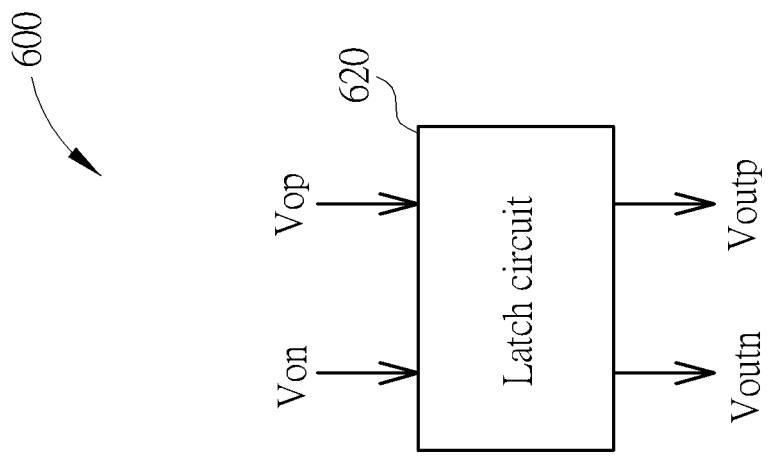
FIG. 6 is a diagram illustrating a dynamic comparator according to one embodiment of the present invention.
Figure 6:
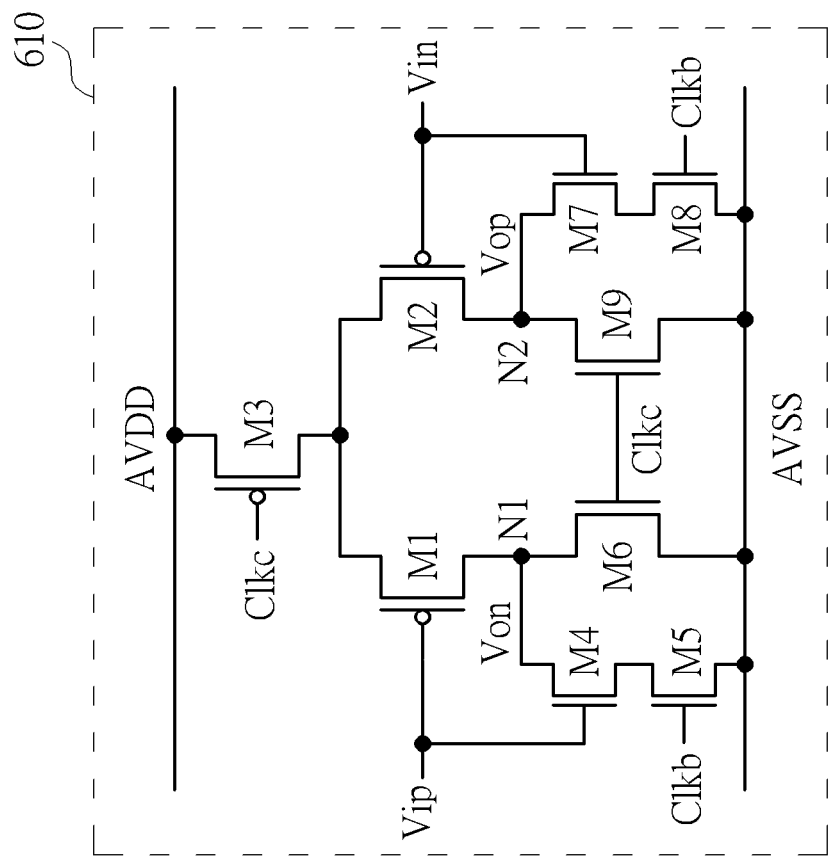

In the embodiment shown in FIG. 1, the transistors M1 and M2 serving as the main input pair are implemented by NMOSs, and the transistors M4 and M7 serving as the additional input pair are implemented by PMOSs, however in another embodiment, the main input pair can be implemented by PMOSs while the additional input pair is implemented by NMOSs. Specifically, FIG. 6 is a diagram illustrating a dynamic comparator 600 according to one embodiment of the present invention. As shown in FIG. 6, the dynamic comparator 600 comprises a dynamic amplifier 610 and a latch circuit 620, wherein the dynamic amplifier 610 comprises transistors M1-M9 coupled between a reference voltage AVDD (i.e. a supply voltage) and a reference voltage AVSS (i.e., a ground voltage). The dynamic comparator 600 can be used in any circuit requiring higher gain and lower power consumption, such that the dynamic comparator 600 can be used in a SAR ADC.

In the dynamic comparator 600, the dynamic amplifier 610 is configured to receive input signals Vip and Vin (differential input signal) to generate amplified signals Von and Vop (differential amplified signal) at output terminals N1 and N2, and the latch circuit 620 receives the amplified signals Von and Vop to generate output signals Voutn and Voutp. Regarding the dynamic amplifier 610, each of the transistors M1 and M2 is implemented by the PMOS, and the transistors M1 and M2 serve as an input pair to receive the input signals Vip and Vin to generate the amplified signals Von and Vop at the gain electrodes of the transistors M1 and M2 (i.e., the output terminals N1 and N2). The transistor M3 is implemented by the PMOS coupled between the source electrode of the transistor M1/M2 and the reference voltage AVDD, and the transistor M3 serves as a current source that is used to enable or disable the amplification phase of the dynamic amplifier 610. Each of the transistors M4-M9 is implemented by the NMOS, wherein the transistors M4 is coupled to the output terminal N1, the transistor M5 is coupled between the reference voltage AVSS and the transistor M4, the transistor M6 is coupled between the reference voltage AVSS and the output terminal N1, the transistors M7 is coupled to the output terminal N2, the transistor M8 is coupled between the reference voltage AVSS and the transistor M7, the transistor M9 is coupled between the reference voltage AVSS and the output terminal N2. The transistors M4 and M7 serve as another input pair to receive the differential input signal Vip and Vin to boost the gain of the dynamic amplifier 610. In this embodiment, the transistors M3, M6 and M9 are controlled by a clock signal Clkc, and the transistors M5 and M8 are controlled by a clock signal Clkb, wherein the clock signal Clkc is used to enable the transistor M3 to amplify the input signals Vip and Vin to generate the amplified signals Von and Vop, and the clock signal Clkb is used to disable the M5 and M8 when the latch circuit 620 successfully generates the output signals Voutn and Voutp to lower the power consumption. In addition, the clock signal Clkb is generated according to the clock signal Clkc, and the clock signal Clkb can enable or disable the transistors M5 and M8 at an appropriate time.

The timing diagram of the signals in the dynamic amplifier 610 is similar to the embodiment shown in FIG. 2, the dynamic amplifier 610 has two input pairs, one input pair comprises the transistors M1 and M2 (PMOS), and the other input pair comprises the transistors M4 and M7 (NMOS), and because the transistors M4 and M7 are used to sink the current from the output terminals N1 and N2, the gain of the dynamic amplifier 110 will increase. In addition, because the transistors M1 and M2 provide the tranconductance gmp, the transistors M4 and M7 provide the tranconductance gmn, and the tranconductance gmn and the tranconductance gmp are partially overlapped, so the dynamic amplifier 610 will have higher gain and longer amplification phase. In addition, the generation of the clock signal Clkb can refer to the embodiments shown in FIG. 4 and FIG. 5, so the detailed descriptions of the dynamic comparator 600 are omitted here.

Figure 7:
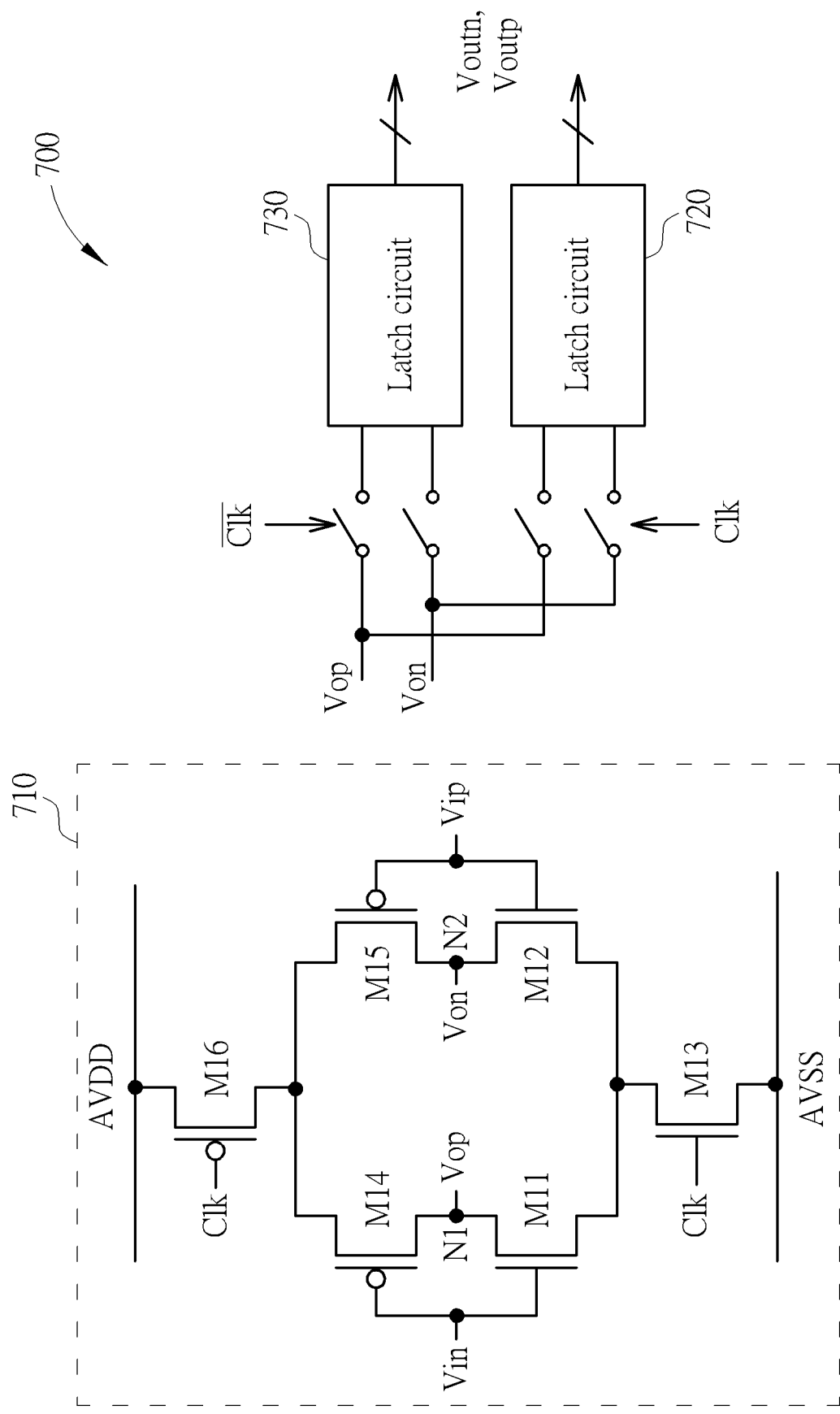
FIG. 7 is a diagram illustrating a dynamic comparator according to one embodiment of the present invention.

In the embodiments shown in FIGS. 1 and 6, the dynamic amplifier 110/610 samples the input signals Vin/Vip only at the rising edge of the clock signal Clkc. In another embodiment, the dynamic amplifier can be designed to sample the input signals Vin/Vip at both the rising edge and the falling edge of the clock signal. Specifically, FIG. 7 is a diagram illustrating a dynamic comparator 700 according to one embodiment of the present invention. As shown in FIG. 7, the dynamic comparator 700 comprises a dynamic amplifier 710 and two latch circuits 720 and 730, wherein the dynamic amplifier 710 comprises transistors M11-M16 coupled between a reference voltage AVDD (i.e. a supply voltage) and a reference voltage AVSS (i.e., a ground voltage). The dynamic comparator 700 can be used in any circuit requiring higher gain and lower power consumption, such that the dynamic comparator 700 can be used in a SAR ADC.

In the dynamic comparator 700, the dynamic amplifier 710 is configured to receive input signals Vip and Vin (differential input signal) to generate amplified signals Von and Vop (differential amplified signal) at the rising edge and falling edge of the clock signal Clk, the latch circuit 720 receives the amplified signals Von and Vop generated in response to the rising edge of the clock signal Clk to generate output signals Voutn and Voutp, and the latch circuit 730 receives the amplified signals Von and Vop generated in response to the falling edge of the clock signal Clk to generate output signals Voutn and Voutp. Regarding the dynamic amplifier 710, each of the transistors M11 and M12 is implemented by the NMOS, and the transistors M11 and M12 serve as an input pair to receive the input signals Vip and Vin to generate the amplified signals Von and Vop at the gain electrodes of the transistors M1 and M2 (i.e., the output terminals N1 and N2). The transistor M13 is implemented by an NMOS coupled between the source electrode of the transistor M11/M12 and the reference voltage AVSS, and the transistor M13 serves as a current source that is used to enable or disable the amplification phase corresponding to the transistor M11/M12 of the dynamic amplifier 710. Each of the transistors M14 and M15 is implemented by a PMOS, wherein the transistors M14 and M15 serve as another input pair to receive the input signals Vip and Vin to generate the amplified signals Von and Vop at the gain electrodes of the transistors M14 and M15 (i.e., the output terminals N1 and N2). The transistor M16 is implemented by a PMOS coupled between the source electrode of the transistor M14/M15 and the reference voltage AVDD, and the transistor M16 serves as a current source that is used to enable or disable the amplification phase corresponding to the transistor M14/M15 of the dynamic amplifier 710. In this embodiment, the transistors M13 and M16 are controlled by a clock signal Clk.

Regarding the latch circuits 720 and 730, when the dynamic amplifier 710 samples the input signals Vin and Vip at the rising edge of the clock signal Clk to generate the amplified signals Vop and Von, the switches corresponding to the latch circuit 720 are enabled so that the latch circuit 720 receives the amplified signals Vop and Von to generate the output signals Voutp and Voutn. In addition, when the dynamic amplifier 710 samples the input signals Vin and Vip at the falling edge of the clock signal Clk to generate the amplified signals Vop and Von, the switches corresponding to the latch circuit 730 are enabled so that the latch circuit 730 receives the amplified signals Vop and Von to generate the output signals Voutp and Voutn.

Figure 8:
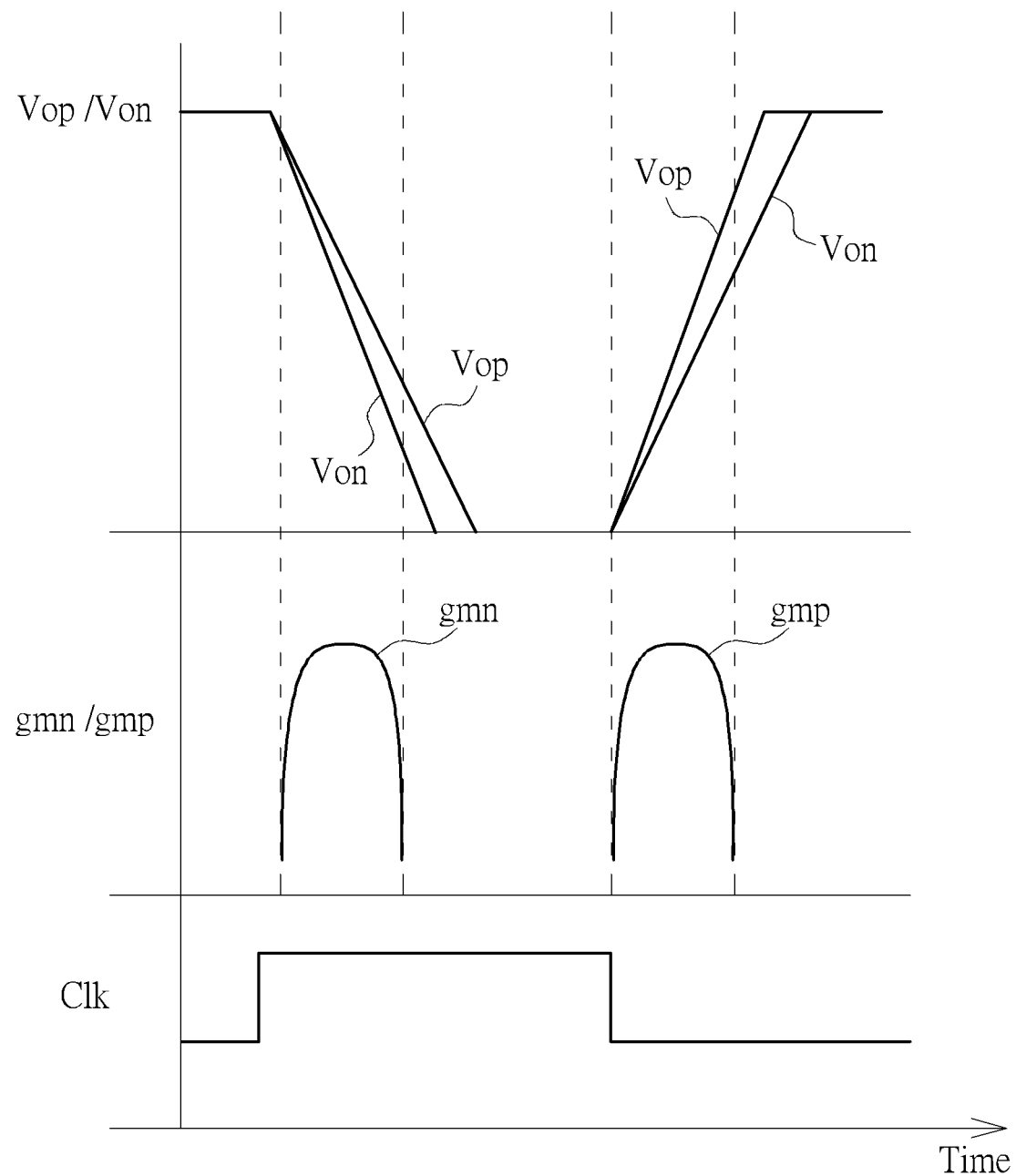
FIG. 8 shows a timing diagram of the signals and characteristics of the dynamic amplifier of FIG. 7 according to one embodiment of the present invention.

FIG. 8 shows a timing diagram of the signals and characteristics of the dynamic amplifier 710 according to one embodiment of the present invention. In the beginning, the clock signal Clk has the low voltage level, so the transistor M13 is disabled while the transistor M16 is enabled, and the amplified signals Von and Vop have high voltage level. Then, when the voltage level of the clock signal Clk starts to increase, the transistor M13 is enabled and a current path is formed, so that the voltage levels of the amplified signals Von and Vop starts to decrease. At this time, the dynamic amplifier 710 works like an integrator, the transistors M11 and M12 operate in a saturation region, and the transistors M11 and M12 have higher transconductance (i.e., the symbol "gmn" in FIG. 8) to increase the gain of the dynamic amplifier 710. Then, when the amplified signals Von and Vop drop to a threshold voltage level, the transistors M11 and M12 do not operate in the saturation region, the transistors M11 and M12 have lower transconductance, and the gain of the dynamic amplifier 710 decreases.

In addition, when the voltage level of the clock signal Clk starts to decrease (i.e., falling edge), the transistor M16 is enabled and a current path is formed, so that the voltage levels of the amplified signals Von and Vop starts to increase. At this time, the dynamic amplifier 710 works like an integrator, the transistors M14 and M15 operate in a saturation region, and the transistors M14 and M15 have higher transconductance (i.e., the symbol "gmp" in FIG. 8) to increase the gain of the dynamic amplifier 710. Then, when the amplified signals Von and Vop reach a threshold voltage level, the transistors M14 and M15 do not operate in the saturation region, the transistors M14 and M15 have lower transconductance, and the gain of the dynamic amplifier 710 decreases.

In the embodiment shown in FIG. 7 and FIG. 8, the dynamic amplifier 710 have two input pairs, one input pair is the transistors M11 and M12 (NMOS), and the other input pair is the transistors M14 and M15 (PMOS). Therefore, because the two input pairs are configured to sample the input signals Vin/Vip at the rising edge and the falling edge of the clock signal Clk, respectively, the dynamic amplifier 710 will have higher efficiency.

Figure 9:
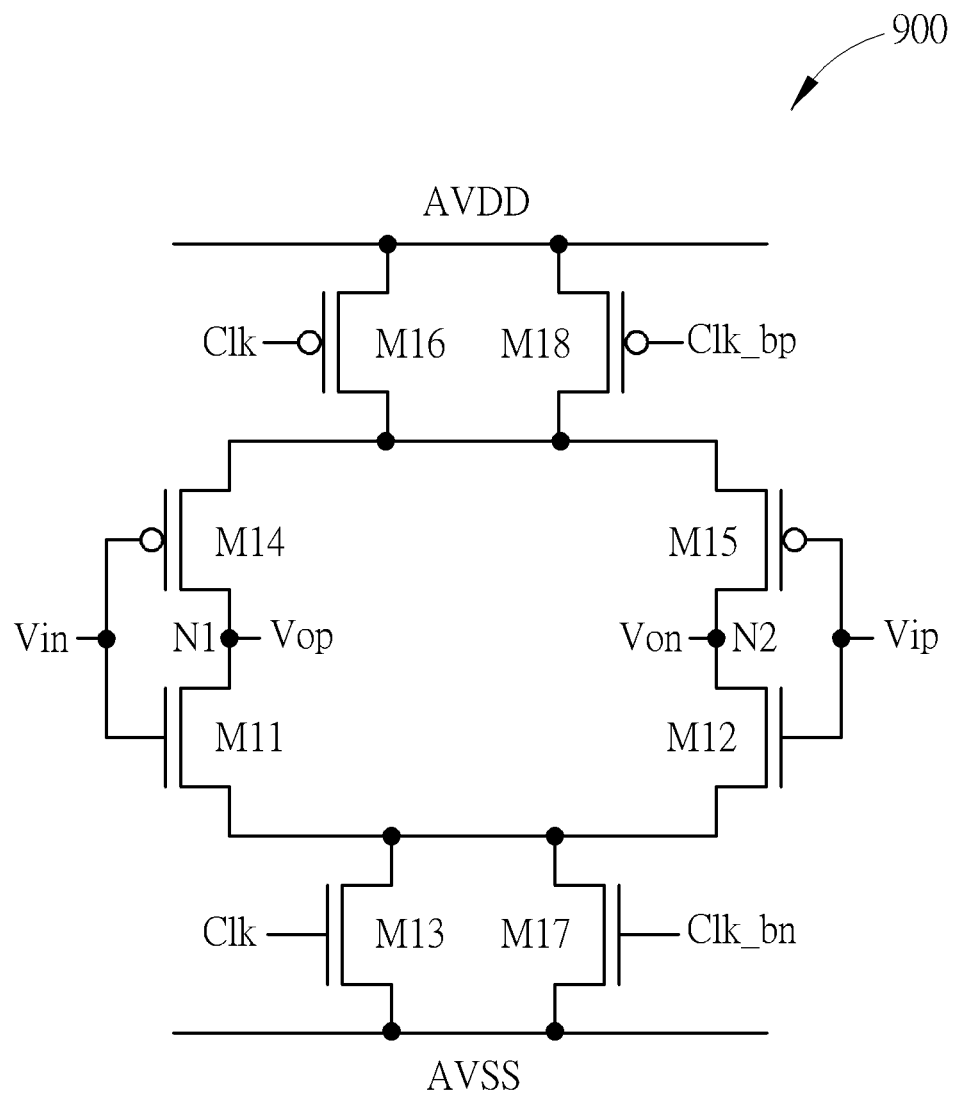
FIG. 9 shows a dynamic amplifier 900 according to one embodiment of the present invention.

In one embodiment, the dynamic amplifier 710 can be modified to have the gain-boosted technique shown in FIG. 1. Specifically, FIG. 9 shows a dynamic amplifier 900 according to one embodiment of the present invention. As shown in FIG. 9, compared with the dynamic amplifier 710, the dynamic amplifier 900 further comprises a transistor M17 coupled between the source electrode of the transistor M12 and the reference voltage AVSS, and a transistor M18 coupled between the source electrode of the transistor M15 and the reference voltage AVDD. In this embodiment, the transistors M17 and M18 can be regarded as a gain-boosting circuit to boost the gain of the dynamic amplifier 710. The transistor M17 is controlled by a clock signal Clk_bn to provide the transconductance when the transistors M14 and M15 of the dynamic amplifier 900 samples the input signals Vin and Vip at the falling edge of the clock signal Clk, to boost the gain of the dynamic amplifier 900. The transistor M18 is controlled by a clock signal Clk_bp to provide the transconductance when the transistors M11 and M12 of the dynamic amplifier 900 samples the input signals Vin and Vip at the rising edge of the clock signal Clk, to boost the gain of the dynamic amplifier 900.

Figure 10:
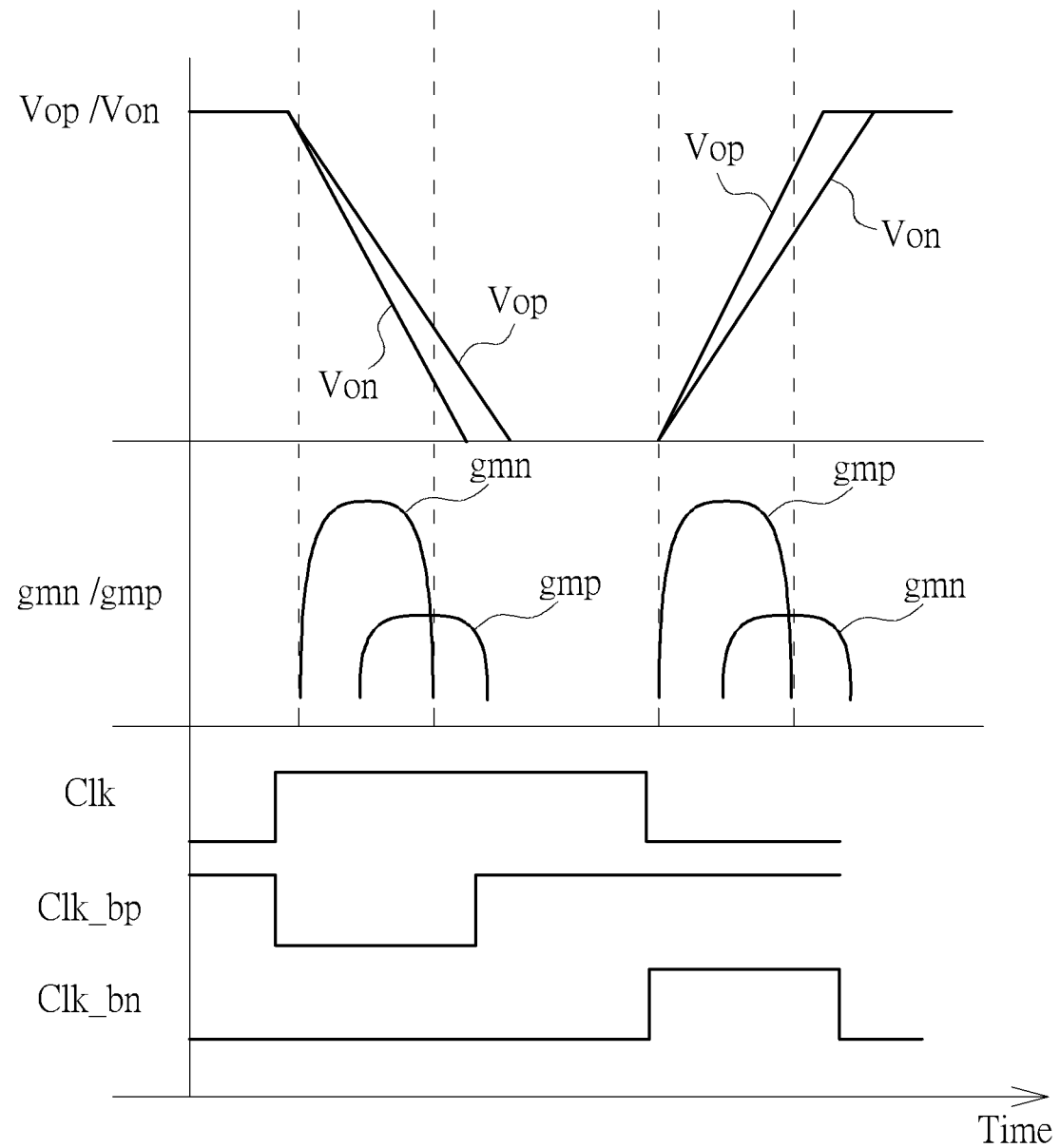
FIG. 10 shows a timing diagram of the signals and characteristics of the dynamic amplifier of FIG. 9 according to one embodiment of the present invention.

FIG. 10 shows a timing diagram of the signals and characteristics of the dynamic amplifier 910 according to one embodiment of the present invention. In the beginning, the clock signal Clk has the low voltage level, so the transistor M13 is disabled while the transistor M16 is enabled, and the amplified signals Von and Vop have high voltage level. Then, when the voltage level of the clock signal Clk starts to increase, the transistor M13 is enabled and a current path is formed, so that the voltage levels of the amplified signals Von and Vop starts to decrease. At this time, the dynamic amplifier 900 works like an integrator, the transistors M11 and M12 operate in a saturation region, and the transistors M11 and M12 have higher transconductance (i.e., the symbol "gmn" in FIG. 10) to increase the gain of the dynamic amplifier 710. Then, when the amplified signals Von and Vop drop to a threshold voltage such as "Vi+thp"

shown in FIG. 2, the transistor M18 starts to operate in the saturation region, and the transistor M18 has higher transconductance (i.e., the symbol "gmp" in FIG. 10) to increase the gain of the dynamic amplifier 710. Then, when the amplified signals Von and Vop drop to a lower threshold voltage level, the transistors M11 and M12 do not operate in the saturation region, the transistors M11 and M12 have lower transconductance, and the gain of the dynamic amplifier 900 decreases. Therefore, because the transistors M11 and M12 provide the tranconductance gmn, the transistors M14 and M15 provides the tranconductance gmp, and the tranconductance gmn and the tranconductance gmp are partially overlapped, so the dynamic amplifier 900 will have higher gain and longer amplification phase for the sampling operation at the rising edge of the clock signal Clk.

In addition, when the voltage level of the clock signal Clk starts to decrease (i.e., falling edge), the transistor M16 is enabled and a current path is formed, so that the voltage levels of the amplified signals Von and Vop starts to increase. At this time, the dynamic amplifier 900 works like an integrator, the transistors M14 and M15 operate in a saturation region, and the transistors M14 and M15 have higher transconductance (i.e., the symbol "gmp" in FIG. 10) to increase the gain of the dynamic amplifier 900. Then, when the amplified signals Von and Vop increase to a threshold voltage, the transistors M11 and M12 starts to operate in the saturation region, and the transistors M11 and M12 have higher transconductance (i.e., the symbol "gmn" in FIG. 10) to increase the gain of the dynamic amplifier 900. Then, when the amplified signals Von and Vop reach a higher threshold voltage level, the transistors M14 and M15 do not operate in the saturation region, the transistors M14 and M15 have lower transconductance, and the gain of the dynamic amplifier 900 decreases. Therefore, because the transistors M14 and M15 provide the tranconductance gmp, the transistors M11 and M12 provide the tranconductance gmn, and the tranconductance gmn and the tranconductance gmp are partially overlapped, so the dynamic amplifier 900 will have higher gain and longer amplification phase for the sampling operation at the falling edge of the clock signal Clk.

In addition, the clock signal Clk_bp can be generated by using any appropriate logical circuit, as long as the logical circuit can generate the clock signal Clk_bp with the low voltage level to enable the transistor M18 during part of the amplification phase, and the logical circuit can generate the clock signal Clk_bp with the high voltage level when the latch circuit 720 is ready. For example, the clock signal Clk_bp can be generated by using the logical circuit 400 or the logical circuit 500, that is the logical circuit can receive the output signals Voutn, Voutp and the clock signal Clk to generate the clock signal Clk_bp, or the logical circuit can receive the amplified signals Von, Vop and the clock signal Clk to generate the clock signal Clk_bp. As long as the logical circuit can generate the clock signal Clk_bp with the low voltage level to enable the transistor M18 during part of the amplification phase, and the logical circuit can generate the clock signal Clk_bp with the high voltage level when the latch circuit 720 is ready.

Similarly, the clock signal Clk_bn can be generated by using any appropriate logical circuit, as long as the logical circuit can generate the clock signal Clk_bn with the high voltage level to enable the transistor M17 during part of the amplification phase, and the logical circuit can generate the clock signal Clk_bn with the low voltage level when the latch circuit 730 is ready.

Briefly summarized, in the dynamic comparator of the present invention, by using the dynamic amplifier having two input pairs, the dynamic comparator will have higher gain and longer amplification phase, to improve the noise performance. In addition, the present invention further provides a dynamic amplifier capable of sampling the input signals at both the rising edge and the falling edge of the clock signal to increase the efficiency of the dynamic comparator.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A dynamic comparator, comprising:
   a dynamic amplifier, comprising:
      a first input pair, configured to receive an input signal to generate an amplified signal at an output terminal;
      a current source, coupled between the first input pair and a first reference voltage; and
      a gain-boosting circuit, coupled between the first input pair and a second reference voltage, configured to receive the input signal to selectively inject current to the output terminal or sink current from the output terminal; and
   a latch circuit, coupled to the dynamic amplifier, configured to receive the amplified signal to generate an output signal;
   wherein the input signal is a differential input signal, the amplified signal is a differential amplified signal generated at a first output terminal and a second output terminal, the first input pair comprises a first transistor and a second transistor, and the gain-boosting circuit comprises a third transistor and a fourth transistor; and the third transistor is coupled to the first transistor via the first output terminal, the fourth transistor is coupled to the second transistor via the second output terminal, and the differential input signal is inputted into gate electrodes of the first transistor, the second transistor, the third transistor and the fourth transistor;
   wherein the gain-boosting circuit further comprises a fifth transistor and a sixth transistor, the fifth transistor is coupled between the third transistor and the second reference voltage, and the sixth transistor is coupled between the fourth transistor and the second reference voltage; and the current source is controlled by a first clock signal, and the fifth transistor and the sixth transistor are controlled by a second clock signal.

2. The dynamic comparator of claim 1, wherein the first transistor and the second transistors are N-type transistors, and the third transistor and the fourth transistor are P-type transistors.

3. The dynamic comparator of claim 1, wherein the first transistor and the second transistors are P-type transistors, and the third transistor and the fourth transistor are N-type transistors.

4. The dynamic comparator of claim 1, further comprising:
   a logical circuit, configured to receive the first clock signal and the output signal to generate the second clock signal.

5. The dynamic comparator of claim 4, wherein the logical circuit is configured to generate the second clock signal to enable the fifth transistor and the sixth transistor during part of an amplification phase of the dynamic amplifier, and the logical circuit is further configured to generate the second clock signal to disable the fifth transistor and the sixth transistor when the latch circuit successfully generates the output signal.

6. The dynamic comparator of claim 4, wherein the logical circuit is an NAND gate.

7. The dynamic comparator of claim 1, further comprising:
a logical circuit, configured to receive the first clock signal and the amplified signal to generate the second clock signal, wherein the logical circuit is configured to generate the second clock signal to enable the fifth transistor and the sixth transistor during part of an amplification phase of the dynamic amplifier, and the logical circuit is further configured to generate the second clock signal to disable the fifth transistor and the sixth transistor when the latch circuit successfully generates the output signal.

8. The dynamic comparator of claim 1, wherein the first transistor and the second transistor provide a first transconductance to increase a gain of the dynamic amplifier during a first period, the third transistor and the fourth transistor provide a second transconductance to increase the gain of the dynamic amplifier during a second period, the first period is earlier than the second period, and the first period and the second period are partially overlapped.

9. A dynamic comparator, comprising:
a dynamic amplifier, comprising:
  a first input pair and a second input pair, configured to receive an input signal to generate an amplified signal at an output terminal;
  a first current source, coupled between the first input pair and a first reference voltage; and
  a second current source, coupled between the second input pair and a second reference voltage; and
a latch circuit, coupled to the dynamic amplifier, configured to receive the amplified signal to generate an output signal;
wherein the first current source and the second current source are controlled by a first clock signal, so that the first input pair samples the input signal at a rising edge of the first clock signal, and the second input pair samples the input signal at a falling edge of the first clock signal;
wherein the first input pair comprises a first N-type transistor and a second N-type transistor, the second input pair comprises a first P-type transistor and a second P-type transistor, the first N-type transistor is coupled to the first P-type transistor via a first output terminal, the second N-type transistor is coupled to the second P-type transistor via a second output terminal, and an input signal is a differential input signal inputted into gate electrodes of the first N-type transistor, the second N-type transistor, the first P-type transistor and the second P-type transistor; and the first current source is implemented by a third N-type transistor, and the second current is implemented by a third-P-type transistor;
wherein the dynamic amplifier further comprises a gain-boosting circuit, the gain-boosting circuit comprises a fourth N-type transistor and a fourth P-type transistor, the fourth N-type transistor is coupled between the first input pair and the first reference voltage, and the fourth P-type transistor is coupled between the second input pair and the second reference voltage.

10. The dynamic comparator of claim 9, wherein the fourth N-type transistor is controlled by a second clock signal, the fourth P-type transistor is controlled by a third clock signal, and the dynamic comparator further comprises:
a logical circuit, wherein the logical circuit receives the first clock signal and the output signal to generate the second clock signal and the third clock signal, or the logical circuit receives the first clock signal and the amplified signal to generate the second clock signal and the third clock signal.

11. The dynamic comparator of claim 10, wherein the logical circuit is configured to generate the third clock signal to enable the fourth P-type transistor during part of an amplification phase of the first input pair of the dynamic amplifier, and the logical circuit is further configured to generate the third clock signal to disable the fourth P-type transistor when the latch circuit successfully generates the output signal; and the logical circuit is configured to generate the second clock signal to enable the fourth N-type transistor during part of an amplification phase of the second input pair of the dynamic amplifier, and the logical circuit is further configured to generate the second clock signal to disable the fourth N-type transistor when the latch circuit successfully generates the output signal.

* * * * *